Figure 1:
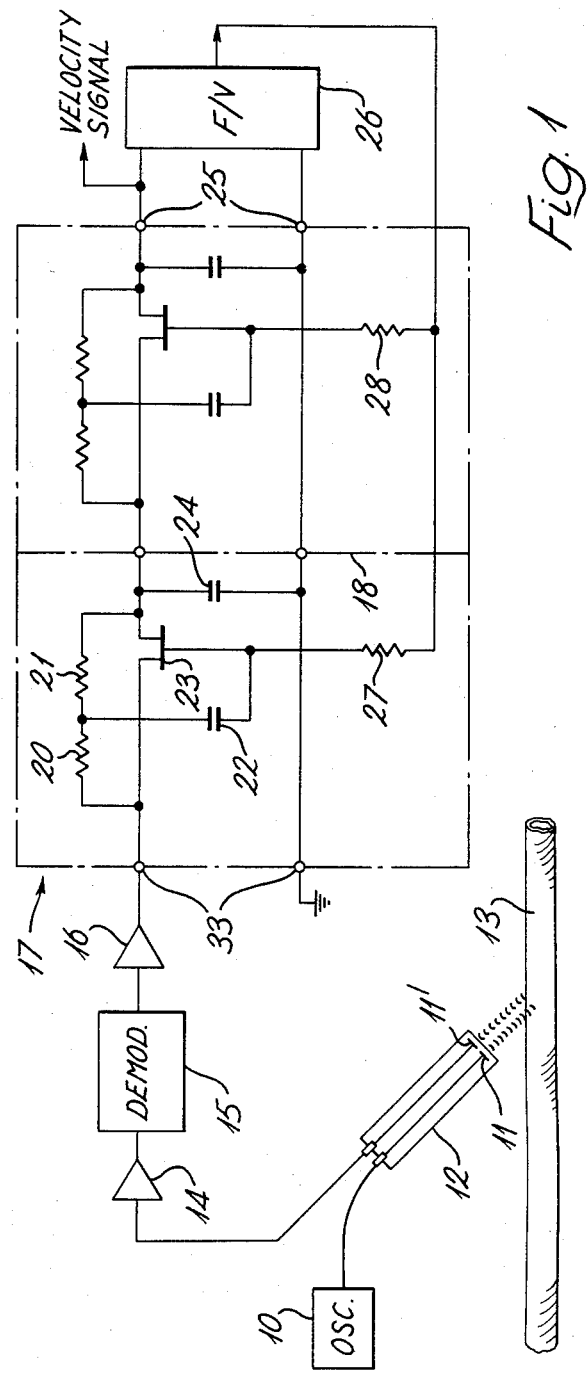

United States Patent [19]

Sainz et al.

[11] Patent Number: 4,540,946

[45] Date of Patent: Sep. 10, 1985

[54] VARIABLE CHARACTERISTIC FILTERS

[75] Inventors: Antonio J. Sainz, Caracas, Venezuela; Victor C. Roberts, London, England

[73] Assignee: National Research Development Corp., London, England

[21] Appl. No.: 564,358

[22] Filed: Dec. 22, 1983

Related U.S. Application Data

[63] Continuation of Ser. No. 269,584, Jun. 2, 1981, abandoned.

[30] Foreign Application Priority Data

Jun. 6, 1980 [GB] United Kingdom ............... 8018571

[51] Int. Cl.³ ............................................ H03B 1/00
[52] U.S. Cl. .................................. 328/167; 128/663; 73/861.25; 307/520
[58] Field of Search ............. 128/663; 73/861.25; 328/167; 333/17, 172, 174; 307/520–521

[56] References Cited

U.S. PATENT DOCUMENTS

| | | |
|---|---|---|
| 3,078,421 | 2/1963 | Heuer et al. |
| 3,327,210 | 6/1967 | Wu |
| 3,409,373 | 11/1968 | Matthews |
| 3,528,040 | 9/1970 | Galvin |
| 3,576,564 | 4/1971 | Galvin |
| 3,604,947 | 9/1971 | Putbuff |
| 3,678,416 | 6/1972 | Burwen |
| 3,763,851 | 10/1973 | Haff et al. ........................ 128/661 |
| 3,806,839 | 4/1974 | Iwakami |
| 3,889,108 | 6/1975 | Cantrell |
| 3,930,727 | 1/1976 | Vergato |
| 3,934,577 | 1/1976 | Romani ............................ 128/661 |
| 3,960,043 | 6/1976 | Brand |
| 3,991,365 | 11/1976 | Takeuchi ........................... 128/660 |
| 4,027,264 | 5/1977 | Gutteber .......................... 328/167 |
| 4,038,539 | 7/1977 | Van Cleave |
| 4,062,237 | 12/1977 | Fox ................................ 128/663 X |
| 4,091,236 | 5/1978 | Chen ............................. 328/167 X |
| 4,110,713 | 8/1978 | Martin |
| 4,114,117 | 9/1978 | Ford |
| 4,122,713 | 10/1978 | Stasz et al. ..................... 128/663 X |
| 4,207,543 | 6/1980 | Izokson et al. .................. 328/167 X |
| 4,213,466 | 7/1980 | Stalen ............................ 128/733 |
| 4,213,467 | 7/1980 | Stulen et al. .................... 128/733 |
| 4,255,977 | 3/1981 | Newhouse et al. ............. 128/663 X |
| 4,453,137 | 6/1984 | Rittenbach ..................... 328/167 X |

FOREIGN PATENT DOCUMENTS

| | | |
|---|---|---|
| 478734 | 1/1938 | United Kingdom |
| 478605 | 1/1938 | United Kingdom |
| 656545 | 8/1951 | United Kingdom |
| 685483 | 1/1953 | United Kingdom |
| 1087816 | 10/1967 | United Kingdom |
| 1120541 | 7/1968 | United Kingdom |
| 1215566 | 12/1970 | United Kingdom |
| 1384944 | 2/1975 | United Kingdom |
| 1393690 | 5/1975 | United Kingdom |
| 1469058 | 3/1977 | United Kingdom |

OTHER PUBLICATIONS

Callicot, C. et al., "A Max Frequency Detector for Doppler Blood Velocimeters", Jrnl. Med. Engi. & Technol., vol. 3, #2, Mar. 1979, pp. 80–82.

Takeuchi, Y. et al., "An Adaptive Correlation Ratemeter: A New Method for Doppler Fetal HR Measurements", Ultrasonics, May 1978, vol. 16, #3, pp. 127–137.

Fehr, R., "A New MTI Structure with Inherent A/D Conversion", Conf: Crkt Theory and Design, Lausanne Swtz., Sep. 4–8, 1978, pp. 528–532.

Skidmore, R. et al., "Max Freq. Follower for Processing of UTS Doppler Signals", UTS in Med. & Biol., vol. 4, No. 2, pp. 145–147, 1978.

Yoganathon, A. P. et al., "Laser-Doppler Anemometer to Study Velocity in Vicinity of Prosth. Hrt. Valves", Med. & Biol. Engry. & Comput., 1979 (17) pp. 38–44.

Primary Examiner—Kyle L. Howell
Assistant Examiner—Francis J. Jaworski
Attorney, Agent, or Firm—Cushman, Darby & Cushman

[57] ABSTRACT

A variable characteristic filter is described in which output signals are frequency analyzed by means of a frequency-to-voltage converter to derive a control signal. Variable impedance elements in the filter are controlled by the control signal to vary the filter characteristic automatically. The filter, including the frequency-to-voltage converter, may be such that the filter attenuation is reduced in the frequency region where the input or output signals mainly occur. The invention is particularly useful in Doppler blood-flow velocimeters to reduce noise.

8 Claims, 2 Drawing Figures

VARIABLE CHARACTERISTIC FILTERS

This is a continuation of application Ser. No. 269,584, filed June 2, 1981, now abandoned.

The present invention relates to filters having controllable variable characteristics and is particularly but not exclusively useful in Doppler ultrasonic blood velocimeters.

In a Doppler blood-flow velocimeter a transmitter projects a beam of ultrasound towards a vessel in which blood velocity is to be measured. Different elemental flows of blood in the vessel back-scatter the beam in all directions and a receiver picks up some of this scattered power. The shifts in frequency of signals from the receiver are then proportional to velocities of blood in the vessel.

When an assessment is made of the condition of a blood vessel, velocity signals may be displayed on an oscilloscope or recorded on a chart but a further effective method is to listen to audio versions of the velocity signals. However problems associated with the continuous use of Doppler velocimeters, particularly when the patient's pulse is weak, include operator fatigue and lack of signal discrimination produced by noise in the system.

According to the present invention there is provided signal processing apparatus comprising a filter circuit constructed to pass signals within a predetermined frequency range, and having a variable low attenuation range delimited from at least one variable high attenuation range by a variable cut-off frequency, the cut-off frequency occurring, at least when signals at some particular frequencies are applied to the filter, within the said predetermined frequency range, frequency analysis means capable of analysing over substantially the whole of the said predetermined frequency range signals applied to the filter circuit input or appearing at its output, the frequency analysis means providing an output signal representative of the frequency content of signals applied to the analysis means other than noise signals occuring at random frequencies, and control means for controlling the cut-off frequency in accordance with the output of the frequency analysis means to cause the filter to pass substantially all filter input signals which occur within the said predetermined frequency range and are not noise signals occurring at random frequencies at random frequencies.

The filter circuit may, for example, be low-pass, high-pass, or band-pass where there are two cut-off frequencies both of which may be variable.

In blood Doppler velocimetry a low-pass filter is used to remove noise and it is an advantage of the present invention that if a low-pass filter according to the invention is used a large futher reduction in noise can be achieved. The frequency content of the received Doppler signal changes throughout the cardiac cycle and the cut-off frequency of the filter, which in the absence of a filter output signal is low, rises and falls as velocities increase and fall in the cycle. In this way the cut-off frequency is always kept just above the frequency of the Doppler signal corresponding to the maximum component velocity of blood flow, so reducing noise. Since signals can be weak at low velocities when the cut-off frequency of the filter would, but for the invention, be high in comparison, noise reduction due to the invention is particularly effective for normally occurring weak signals.

The frequency analyser or the monitor means may comprise a frequency-to-voltage converter which may be in the form of a phaselocked loop (PLL).

The control means may comprise filter elements, or components which are field-effect transistors (FETs), the gate electrodes of the FETs being connected to receive the control signal.

Figure 2:
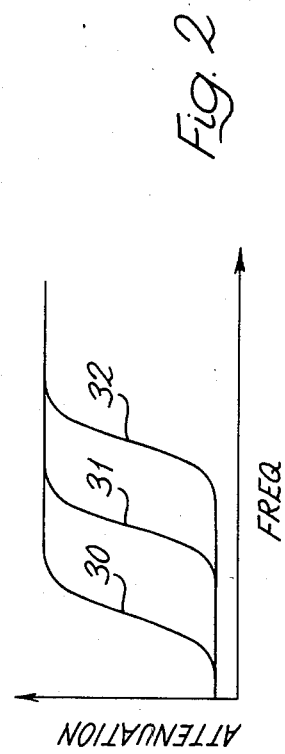

An embodiment of the invention will now be described, by way of example, with reference to the accompanying drawings, in which:

FIG. 1 is a block diagram of a Doppler blood velocity meter incorporating a filter circuit according to the invention, and FIG. 2 is a graph of an attenuation versus frequency characteristic of the filter circuit of FIG. 1.

In FIG. 1 an oscillator 10 typically operating at 5 MHz is coupled to a transmitter crystal 11 in an ultrasonic probe 12. In operation the probe 12 is positioned so that ultrasound is transmitted as nearly as possible to insonate the whole of a blood vessel 13 in which blood velocities are to be measured at an angle which is ideally not perpendicular to the longitudinal axis of the blood vessel. This configuration is to ensure that ultrasound emitted from the crystal 11 has a substantial component along the axis of the blood vessel 13.

Sound reflected from blood flowing in the vessel 13 is received by a receive crystal 11' which, due to the Doppler effect, generates an electrical signal having a spectrum of frequencies related to the different velocities of blood flowing in the vessel 13. The probe 12 and the oscillator 10 form the basis of a known ultrasonic Doppler velocity meter which is described for example in "Blood Flow Velocity and Acceleration Measurements by Doppler Shifted Ultrasound" in Non-invasive Clinical Measurements edited by Taylor D and Whamond J., Pitman Medical, Tunbridge Wells, Chapter 1 (1977).

The output signal from the crystal 11' contains a number of different frequencies each representative of a different velocity in the vessel 13. However velocities and therefore frequencies tend to be grouped around a particular velocity which rises from zero to a maximum and returns to zero during the cardiac cycle.

After amplification in an amplifier 14 the signal is demodulated in a demodulator 15. The resulting audio signal, in which signals at different frequencies represent corresponding velocities, is passed to a variable characteristic filter 17 by way of an amplifier 16.

After demodulation the frequency spectrum contains a peak normally between zero and two hundred Hertz due to movement of blood vessel walls. The peak is preferably removed by a high-pass filter (not shown).

After removal of the peak, the spectrum can contain a group of signals with adjacent frequencies which rise during the systolic portion of the cardiac cycle but frequencies are mostly distributed roughly evenly from zero up to a maximum frequency which falls during the diastolic portion of the cycle.

The variable characteristic of the filter 17 is arranged, as described below, so that its cut-off frequency is always just above the highest frequency in the spectrum. Thus noise signals occurring at random frequencies are rejected by the filter if they are above the highest current signal frequency (excluding noise) generated by the Doppler demodulation.

The filter 17 is a two section bridged "T" low-pass filter with the two sections divided in FIG. 1 by the dashed line 18. The first section comprises two resistors 20 and 21 coupled between input and output terminals of the section. The junction of these resistors is connected by way of a capacitor 22 to the gate terminal of a FET 23 having source and drain terminals connected to the input and output terminals of the section, respectively. The first filter section is shunted by a capacitor 24. Except for the FET 23 the basic configuration of the section is, of course, well known. The second section is similar to the first in general layout but may use different component values, and where better discrimination is required further filter sections may be added. No further description of the filter sections will be given in view of the extensive published material on the subject, except to give typical values, later, for a first section. Filter design is described in "Analysis, Transmission and Filtering of Signals" by Javid and Brennar, published by McGraw Hill (1963).

Output terminals 25 of the filter 17 are connected to a frequency-to-voltage converter circuit 26 which applies a unidirectional voltage of magnitude proportional to the instantaneous mean of the frequencies of signals at the filter output to resistors 27 and 28 connected to the gate electrodes of the FETs of the two sections of the filter 17. Thus the equivalent resistances of the FETs are controlled according to the frequency content of the filter output signal and the filter characteristic changes with change of FET impedance between source and drain terminals.

The type of filter shown in FIG. 1 has a characteristic as shown in FIG. 2, that is a low-pass characteristic. If there is no output signal from the converter 26, the filter characteristic is as designated 30 in FIG. 2. With increasing output from the converter the characteristic moves progressively through the position 31 until it reaches a final position 32 with maximum voltage the converter 26 is able to deliver.

As has been mentioned, blood velocities at the start of the cardiac cycle are low and hence the output voltage of the converter 26 is low giving a low cut-off frequency for the filter 17, just above frequencies corresponding to these low blood velocities. Audio signals representing velocities are then available at the terminals 25 where they can be applied to a sound transducer, for example earphones or a loudspeaker, or applied to a further frequency-to-voltage converter (not shown) to provide a signal for display on a recorder or an oscilloscope. In each case noise from the frequency band above the cut-off frequency of the filter 17 is practically eliminated.

As blood velocities rise the output voltage of the converter 26 rises and the signal is applied to the FETs in the filter 17 cause their resistances between source and drain terminals to change raising the filter cut-off frequency. In this way the cut-off frequency "tracks" the signals representing the maximum blood velocities always keeping noise to a minimum by substantially removing noise at frequencies in the band starting just above the signals representing the maximum blood velocities, and extending theoretically to infinite frequency. As these blood velocities fall later in the cardiac cycle the cut-off frequency also falls.

The frequency-to-voltage converter may be a PLL, a suitable integrated circuit being a Signetics type 562. For normal frequency to voltage conversion a capacitor $C_D$ (not shown), typically of 0.01 μF is connected between pin 10 and ground. For obtaining the instantaneous mean frequency the value may be increased to give any desired output bandwidth, the −3 dB bandwidth being specified by the formula $$F_{3db} = \frac{1}{2\pi C_D 8 \times 10^3}$$

In practice the bandwidth may be limited to about 20 Hz but may need to be greater if the filter is used to track signals arising from turbulent flow disturbances.

The voltage derived by the phase-sensitive detector in the PLL and applied to the internal voltage-controlled oscillator forms the output of the converter 26 which controls the filter 17. In a typical filter section the FET 23 is a type 2N 3820, the capacitors 23 and 24 have values of 0.01 micro Farads, respectively, the resistors 20 and 21 are each 820 Kohms and the resistor 27 is of 2.2 Mohms. Both sections of the filter illustrated may have components of the same value, although other values may be used.

A PLL has the property that it provides a voltage proportional to the mean frequency of periodic signals applied to it, allowing for the amplitudes at the various frequencies in calculating the mean. Hence the PLL analyses the frequency spectrum and determines the instantaneous mean frequency. The cut-off frequency of the filter is designed to be twice the current mean frequency as indicated by the PLL output voltage. In alternative embodiments of the invention other characteristics of the frequency spectrum may be used to control the filter cut-off, for example the maximum frequency can be used. In other applications it might be useful to determine and use the median frequency.

The frequency-to-voltage converter may be connected to input terminals 33 of the filter instead of at the output terminals 25 since it is only necessary that the frequency content of the Doppler signals be analysed to provide a control signal for the filter.

Alternative means of obtaining a signal corresponding to the instantaneous mean frequency of the Doppler signal, are zero crossing detectors as described in Lunt M. "Accuracy and Limitations of the Ultrasonic Doppler Blood Velocimeter and Zero Crossing Detector" in Ultrasound in Medicine and Biology 1975, volume 2, page 1, and analogue analysis as described by Roevros J. M. J. G. in "Analogue Processing of C W Doppler Flowmeter Signals to Determine Average Frequency Shift Momentaneously Without Use of a Wave Analyser" in Cardiovascular Applications in Ultrasound 1974, edited by Reneman R, North Holland Publishing, page 47.

Although the invention has been specifically described in relation to a low-pass filter it will be apparent that it can also be applied to other types of filter such as high-pass filters and band-pass filters. (The above mentioned book by Javid and Brennar describes the design of filters). Filter elements of such filters are made variable so that the cut-off frequency or pass-band is variable in dependence on the variable elements and a control signal which need not, of course, be voltage dependent but which is dependent on the frequency content of the filter input or output signal, is applied to control the variable elements.

The practical application of the filter of the invention is, of course, not limited to Doppler velocimeters, for example the filter can be usefully employed in any field where signals to be received vary in frequency and it is required to remove noise emanating from frequency bands above and/or below the variable frequency required signal. Such applications include other systems employing Doppler techniques using transmitted radio-frequency or microwave signals, in addition to other ultrasonic applications, and other applications also occur in telecommunication and high fidelity professional and domestic sound reproducing systems.

We claim:

1. Signal processing apparatus, comprising:
   filter circuit means for filtering input signals within a fixed predetermined frequency range, said filter means having a variable low attenuation portion of said range delimited from a variable high attenuation portion of said range by a variable cut-off frequency, said cut-off frequency falling within said predetermined frequency range whenever signals of particular frequencies are applied to said filter means;
   frequency analysis means for analysing signals within said predetermined frequency range applied to said filter circuit means and for providing an output signal responsive to the periodic frequency content of said applied signals; and
   control means for automatically controlling said variable cut-off frequency in accordance with said output signal of said frequency analysis means to cause the filter to pass substantially all periodic filter input signals which occur within said predetermined frequency range.

2. Signal processing apparatus according to claim 1 in which the filter circuit has one of the following characteristics: low-pass, band-pass and high-pass.

3. Signal processing apparatus according to claim 1 wherein the frequency analysis means comprises a frequency-to-voltage converter.

4. Signal processing apparatus according to claim 3 wherein the frequency-to-voltage converter is a phase-locked loop circuit.

5. Signal processing apparatus according to claim 1 wherein the filter circuit means comprises at least one transistor coupled to receive a control signal from the control means, the transistor being connected to alter the response characteristic of said filter circuit means as said transistor undergoes an impedance change in response to the control signal.

6. A Doppler blood-flow velocimeter comprising signal processing apparatus according to claim 1, an oscillator coupled to an ultrasonic transmit crystal, and an ultrasonic receive crystal coupled to a demodulator for providing variable-frequency audio signals representative of Doppler shifts between signals transmitted by the transmit crystal and received by the receive crystal, the demodulator output being coupled to the input of the signal processsing apparatus.

7. Signal processing apparatus according to claim 1 wherein said filter circuit means has a band pass characteristic having two cut-off frequencies, both cut-off frequencies being automatically controlled by said control means.

8. Signal processing apparatus, comprising:
   filter circuit means for filtering signals within a fixed predetermined frequency range, said means having a variable low attenuation portion of said range delimited from a variable high attenuation portion of said range by a variable cut-off frequency, the cut-off frequency occurring, at least when signals at some particular frequencies are applied to the filter, within said predetermined frequency range;
   phase locked loop circuit means for responding, over substantially the whole of said predetermined frequency range, to signals appearing at terminals of said filter circuit means; and
   control means for automatically controlling said cut-off frequency in accordance with an output of the phase locked loop circuit means, to cause said filter means to pass all periodic input signals of significant amplitude which occur within said predetermined frequency range.

* * * * *